United States Patent [19]

Cote

[11] Patent Number: 5,234,868

[45] Date of Patent: Aug. 10, 1993

[54] METHOD FOR DETERMINING PLANARIZATION ENDPOINT DURING CHEMICAL-MECHANICAL POLISHING

[75] Inventor: William J. Cote, Poughquag, N.Y.

[73] Assignee: International Business Machines Corporation, Armonk, N.Y.

[21] Appl. No.: 969,871

[22] Filed: Oct. 29, 1992

[51] Int. Cl.⁵ .................. H01L 21/302; H01L 21/463
[52] U.S. Cl. .................................. 437/225; 437/194; 437/195; 437/8; 437/974; 156/636; 156/645; 156/626
[58] Field of Search ............... 437/8, 228, 225, 195, 437/194, 974; 156/643, 645, 636, 626

[56] References Cited

U.S. PATENT DOCUMENTS

| | | | |
|---|---|---|---|
| 3,911,562 | 10/1975 | Youmans | 29/590 |
| 4,671,851 | 6/1987 | Beyer et al. | 156/645 |
| 4,735,679 | 4/1988 | Lasky | 156/636 |
| 4,789,648 | 12/1988 | Chow et al. | 437/225 |
| 4,793,895 | 12/1988 | Kaanta et al. | 156/627 |
| 4,839,311 | 6/1989 | Riley | 437/228 |
| 4,879,258 | 11/1989 | Fisher | 437/225 |
| 5,081,421 | 1/1992 | Miller et al. | 324/671 |
| 5,086,011 | 2/1992 | Shiota | 437/61 |
| 5,132,617 | 7/1992 | Leach et al. | 324/207.16 |

Primary Examiner—Olik Chaudhuri
Assistant Examiner—H. Jey Tsai
Attorney, Agent, or Firm—Heslin & Rothenberg

[57] ABSTRACT

A moat is preferably created in a region of an insulation layer on a wafer that will be destroyed when the wafer is cut. The integrated circuit includes a first metal pattern in an active region and a second metal pattern on the moat island. An insulating layer is conformally deposited and chemical-mechanical polishing is performed thereon. The polish rate above the second metal pattern is significantly higher than above the first metal pattern. Polishing is monitored and ended when the second metal pattern is exposed, achieving planarization of the top surface in the active region of the integrated circuit. Monitoring may be visual or electrical. For visual monitoring, the second metal pattern preferably comprises a visually noticeable metal in relation to the insulating layer.

24 Claims, 2 Drawing Sheets

METHOD FOR DETERMINING PLANARIZATION ENDPOINT DURING CHEMICAL-MECHANICAL POLISHING

BACKGROUND OF THE INVENTION

1. Technical Field

The present invention relates generally to a method for planarization during integrated circuit fabrication. More particularly, the present invention relates to an improved method of determining planarization endpoint during chemical-mechanical polishing.

2. Background Art

Planarization is a critical step in integrated circuit fabrication. Planarity is often necessary for the next level processing. For example, photolithography is more difficult without a planar surface, and a planar surface yields better metal coverage in the sputtering technique. One way to planarize is known as chemical-mechanical polishing (CMP). In CMP, a polishing pad and slurry are used to grind down a surface on a wafer. A CMP slurry consists of small particles of controlled size, usually silicon dioxide, in a disbursing solution. The liquid acts as both a lubricant and a travel medium for the particles.

Regardless of the planarization method utilized, a common requirement is knowing when to stop planarization. This could be accomplished by measuring the material thickness before planarization and periodically checking thickness during planarization until the desired thickness, known as planarization endpoint, is achieved. This is not always practical and may slow production. In addition, when the planarization method is CMP, the wafer would have to be cleaned of slurry before each such measurement. This extra step makes inspection of large numbers of wafers in production utilizing CMP expensive.

FIG. 1 depicts a cross-sectional view of an integrated circuit 10 including a substrate 12 covered with insulation layer 14. Metal pattern 16 on insulation layer 14 is conformally covered with a second insulation layer 18.

If planarization of insulation layer 18 is to be done, knowing when to stop planarizing is essential. If planarization ends too soon, the surface will not be completely planar, as shown in FIG. 1 at dashed line 20. At the other extreme, if planarization goes beyond end point 24, metal will be exposed and may be thinned, as shown at dashed line 22.

FIG. 2 depicts the integrated circuit 10 of FIG. 1 before and after a prior art planarization method known as reactive ion etching is performed. A layer of photoresist 26 is added on top of insulation layer 18. As seen in FIG. 2, photoresist layer 26 is not planar. In the prior art method, etching removes resist 26 and insulation 18 down to level 28. As is known in the art, level 28 takes substantially the same shape as resist layer 26 had. Thus, while almost planarized, the prior art method does not give optimum planarization due to the flow characteristics of the photoresist.

Therefore, a need exists for a CMP process which allows rapid inspection of wafers to see if planarization endpoint has been achieved, and is easily incorporated into the fabrication process.

DISCLOSURE OF THE INVENTION

Briefly, the present invention satisfies the need for a production-quality planarization process and overcomes the above-noted deficiencies in the prior art through an improved method for chemical-mechanical polishing of a substrate. According to the principles of the present invention, a layer of insulation is first deposited on the substrate. A metallization pattern is then formed on a first region of the insulation. In a second region of the insulation, a moat is created around an island. A second metallization pattern is then formed on the island. A second layer of insulation is then deposited, conforming to the topography of the substrate, moat, and metal patterns. Conventional chemical-mechanical polishing is done to planarize the second layer of insulation. Due to the presence of the moat, polishing proceeds more quickly in the second region than the first. The polishing process is monitored to detect and stopped when the second metallization pattern is exposed. This results in a layer of planarized insulation above the metal pattern in the first region.

In a second embodiment of the invention, electrical determination of insulation planarization endpoint during chemical-mechanical polishing of a substrate is employed. This second embodiment includes a polishing pad capable of making electrical connection to a conducting surface in contact with it. The steps of the first embodiment up to and including forming the second metallization pattern on the island are followed. The second metal pattern is then grounded, and a second layer of insulation is conformally deposited. Chemical-mechanical polishing is then performed on the second insulation layer until an electrical connection between the polishing pad and the second metal pattern is detected through monitoring.

These, and other objects, features and advantages of this invention will become apparent from the following detailed description of the presently preferred embodiments of the invention taken in conjunction with the accompanying drawings.

BRIEF DESCRIPTION OF THE DRAWINGS

FIG. 3b depicts a top view of the kerf region of the integrated circuit of FIG. 3a.

BEST MODE FOR CARRYING OUT THE INVENTION

Figure 1:
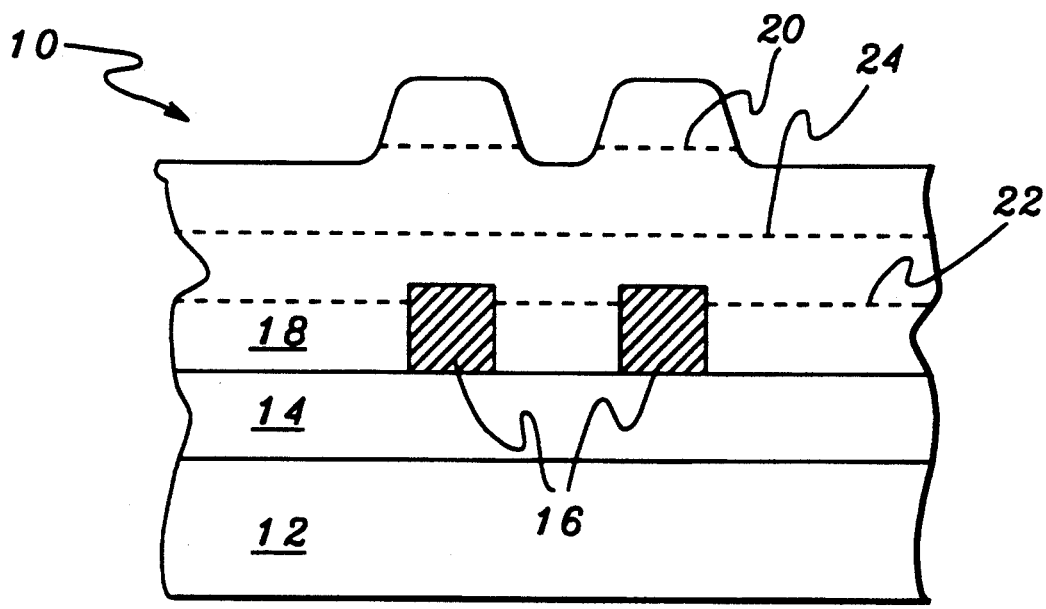
FIG. 1 is a cross-sectional view of an integrated circuit including a metal pattern on a layer of insulation covering a substrate and showing three levels of planarization.
Figure 2:
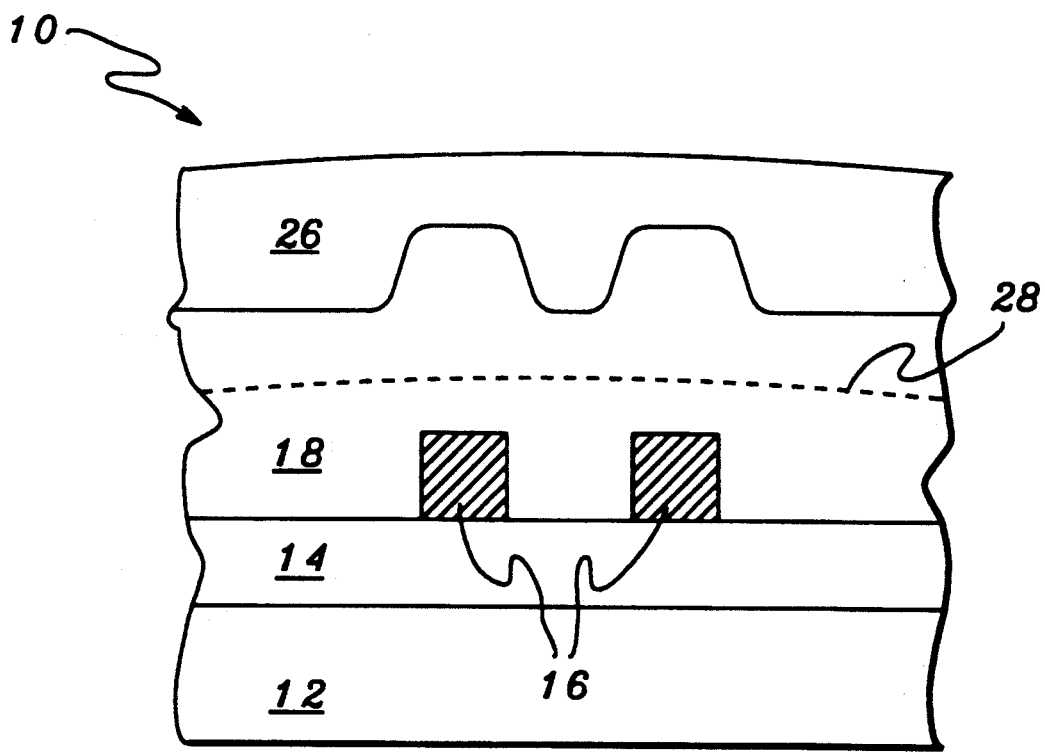
FIG. 2 depicts the integrated circuit of FIG. 1 before and after performing a prior art etchback method with photoresist.
Figure 3A:
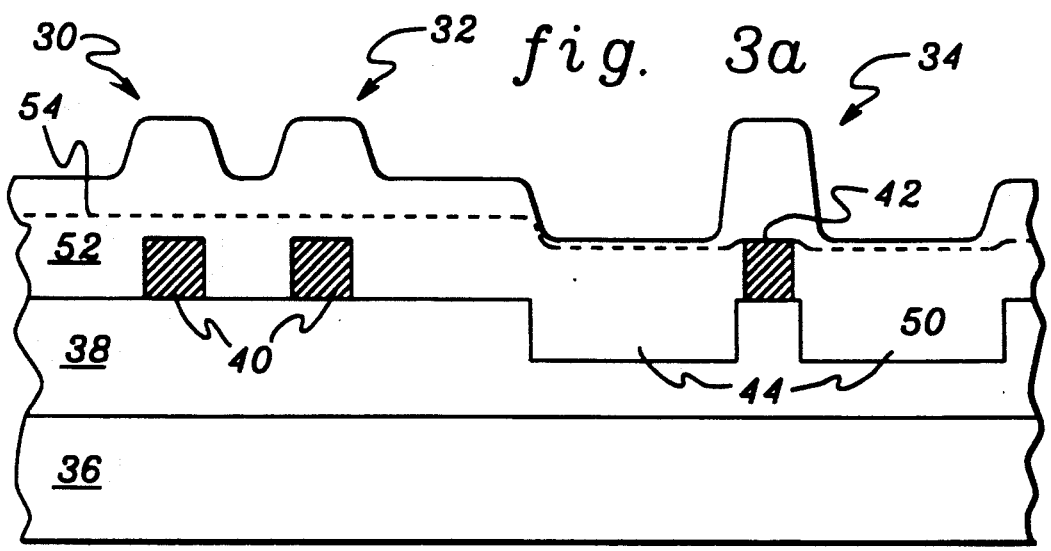
FIG. 3a presents a cross-sectional view of a chip region and a kerf region of an integrated circuit prepared according to the first embodiment of the present invention, before and after planarization.

FIG. 3a provides a cross-sectional view of an integrated circuit 30 before and after planarization takes place in the fabrication process according to the first embodiment of the present invention. FIG. 3a includes two regions representative of those on a wafer in production. Region 32 is a chip region and represents an area where integrated circuits or integrated circuit devices are created. Region 34 is a kerf region that will be destroyed when the wafer is cut into separate integrated circuits. According to the present invention, substrate 36 is entirely covered with a first insulation layer 38. Moat 44 is created in insulation layer 38, surrounding island 50. Metal patterns 40 and 42 are then created on top of insulation layer 38. A second insulation layer 52 conformally covers metal patterns 40 and 42, as well as first insulation layer 38.

Moat 44 is preferably created, for example, by reactive ion etching, prior to metal patterns 40 and 42. The metal patterns may then be formed simultaneously. One way to do this is by depositing a layer of metal on insulation layer 38 after moat 44 has been formed, then removing undesired metal in order to form the metal patterns 40 and 42. As this technique is well-known in the art, the details of metal pattern formation are not discussed herein. Metal pattern 40 can be any integrated circuit or integrated circuit device. For example, metal pattern 40 could be an AND gate or a single transistor. Metal pattern 42 is preferably created in a kerf region 34 of the integrated circuit 30 in production. This is a region that will be turned to dust in the process of cutting the wafer into separate parts or chips. Metal pattern 42 may comprise testing or diagnostic circuitry. For example, metal pattern 42 could be a duplicate of a chip in a chip region of the wafer which is used to test at what point the chip breaks down under a current surge.

After integrated circuit 30 is created, conventional chemical-mechanical polishing of insulation layer 52 is done to planarize the top surface of the chip region 32 in preparation for the next level of processing, which could be, for example, formation of another metal pattern. The purpose of moat 44 is to allow the polishing pad (not shown) to deform around the area of insulation layer 52 above metal pattern 42. The polishing pad will deform, as such pads are typically not perfectly stiff in actual use.

Figure 3B:
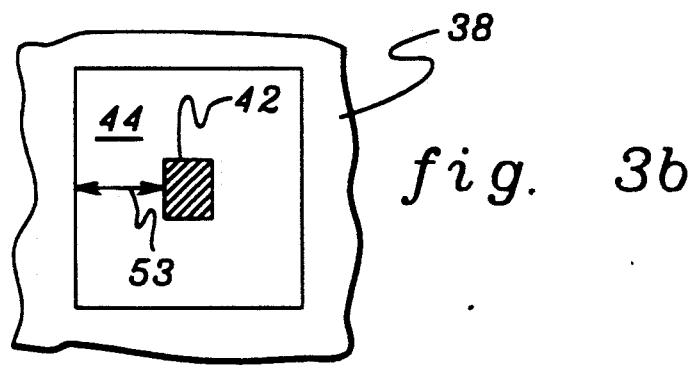

As the polishing pad conforms to the area of insulator 52 above moat 44 around island 50, the insulator above metal pattern 42 is rapidly removed compared to the portion of insulation layer 52 above metal pattern 40. It will be understood that moat 44 surrounds island 50, as depicted in FIG. 3b. Moat 44 is square, and island 50 is centered therein. For example, a moat having a width (shown as 53 in FIG. 3b) of 150 microns and a metal pattern on the island consisting of a square with sides of 25 microns increases insulation removal by about 40% compared to the same metal pattern without a moat. It has also been found that the larger the moat width, the faster will be the removal of insulation above island 50.

For the inventive process to give optimum results, the sum of the depth of moat 44 and the height of metal layer 42 is preferably greater than the thickness of insulation layer 52. In addition, the depth of moat 44 is preferably greater than a desired endpoint thickness difference between insulation layer 52 in chip region 32 and kerf region 34. As an example, consider a moat having a width of about 150 microns and a depth of about 1 micron, metal patterns in the chip and kerf regions of about 7000 angstroms in thickness, and second insulation layer thickness of about 1.45 microns. At endpoint, approximately 3500 angstroms of insulation above the metal pattern in the chip region will remain, while none will remain above the moat island metal pattern in the kerf region.

CMP continues until the portion of insulating layer 52 above metal pattern 42 has been completely removed, as depicted in FIG. 3a by dashed line 54. Preferably, metal pattern 42 comprises a metal that is easily noticed visually in relation to insulation layer 52. As an example, tungsten could be included in metal pattern 42. As shown by line 54, metal pattern 42 is exposed while metal pattern 40 is not. That portion of insulation layer 52 in chip region 32 has now been planarized and is ready for subsequent processing.

Monitoring of CMP is required to end polishing when metal pattern 42 has been exposed. This monitoring may be in the form of visual observation. The wafer need not be washed to check for planarization endpoint, it can merely be lifted by an operator and visually inspected.

Preferably, a plurality of moats of varying widths are included on a substrate in one or more kerf regions. Preferably, the island is in the center of the respective moat. Varying moat widths will allow for varying rates of insulator removal. The larger the width of the moat, the faster the insulator removal rate over the moat islands will be in relation to non-moat regions. Endpoint will be reached upon exposure of a metal pattern on an island surrounded by a midrange moat width. Exposure of metal on an island surrounded by a relatively large moat indicates optimum insulator removal has not yet been achieved. If metal on an island surrounded by a relatively small moat is exposed, endpoint has been surpassed. Continued polishing may lead to a loss of planarity and exposure of chip region metal patterns. By using varying moat widths, the monitoring need not be as frequent, yet planarization endpoint is still achieved.

In a second embodiment, the monitoring is done electrically. The CMP polishing pad is such that it can make an electrical connection between a metal pattern or other conducting surface on the island and monitoring equipment. This type of polishing pad is known in the art and the details thereof will not be described. See U.S. Pat. No. 4,793,895, entitled "In Situ Conductivity Monitoring Technique For Chemical/Mechanical Planarization Endpoint Detection," by Kaanta et al. and assigned to IBM. That patent monitors current flow through chip regions of the wafer during CMP. As previously noted, chip regions are non-kerf areas of the wafer where integrated circuits or integrated circuit devices are created.

Figure 4:
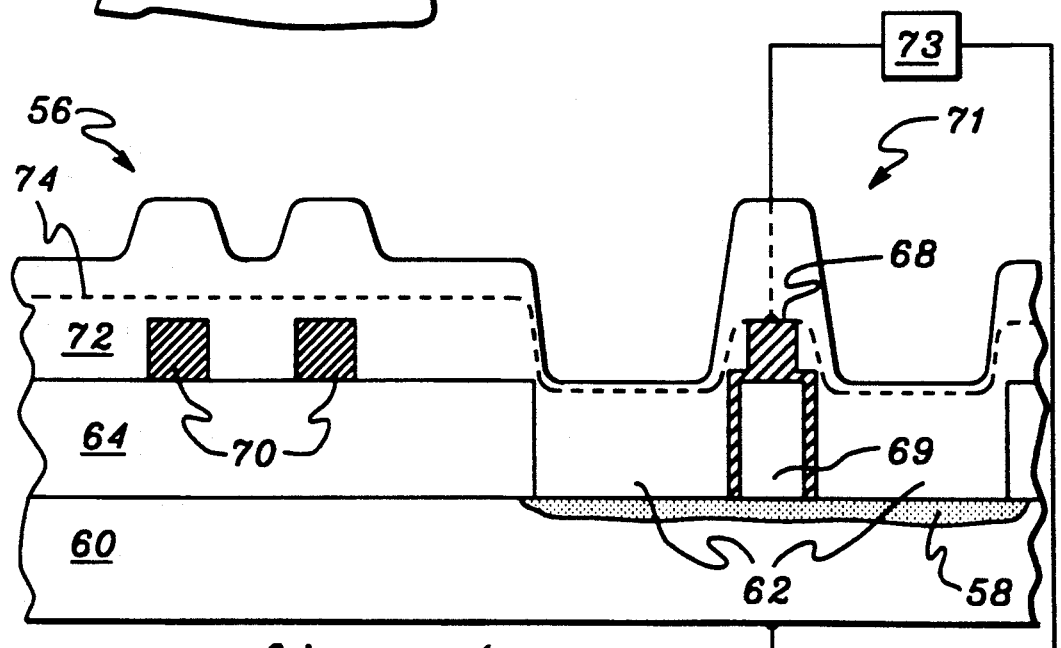
FIG. 4 presents a cross-sectional view of a chip region and a kerf region of an integrated circuit prepared according to the second embodiment of the present invention, before and after planarization.

FIG. 4 depicts a cross-sectional view of an integrated circuit 56 in the fabrication process according to the second embodiment of the present invention, before and after CMP. Diffusion region 58 is a heavily doped region of substrate 60. Moat 62 is created in insulation layer 64 such that diffusion region 58 is exposed. Metal pattern 70 is created over a chip region of substrate 60, and metal pattern 68 is created on island 69 over a kerf region 71 of substrate 60. As in the first embodiment, metal pattern creation may be done by depositing a layer of metal and removing unwanted portions. Preferably, metal pattern 68 makes physical connection to diffusion layer 58. This connection allows substrate 60 to act as a ground for metal pattern 68. Insulation layer 72 is then conformally deposited over metal patterns 68 and 70, as well as insulation layer 64 and diffusion region 58.

CMP is performed on insulation layer 72 until an electrical connection is detected between metal pattern 68 and the polishing pad (not shown) by the monitoring equipment 73. Planarization endpoint is depicted in FIG. 4 as dashed line 74. The monitoring equipment could be, for example, an oscilloscope or even an LED. An operator could then stop CMP according to an appropriate reading on the oscilloscope or when the LED lights. In addition, the process could be automated, allowing the monitoring equipment itself to control turn-off of CMP in response to an electrical connection between the polishing pad and metal pattern 68.

The present invention, as exemplified by the embodiments described herein, advances the state of the art by providing an improved method for chemical-mechanical polishing of an integrated circuit during the fabrication process. A moat surrounding an island with a metal pattern thereon is used to increase the polishing rate in moat regions of an integrated circuit relative to chip regions. Upon detecting (e.g., visually) exposure of the metal, end point has been reached. When several moats of different widths are used, the chances of over-polishing are greatly diminished. This method decreases both production time and waste due to overpolishing. In a second embodiment, monitoring involves making an electrical connection between island metal and the polishing pad. Such a connection signals that endpoint has been reached.

While presently preferred embodiments of the invention have been described and depicted herein, alternative embodiments may be effected by those skilled in the art to accomplish the same objectives. Accordingly, it is intended by the appended claims to cover all such alternative embodiments as fall within the true spirit and scope of the invention.

I claim:

1. A method for determining planarization endpoint in chemical-mechanical polishing during integrated circuit fabrication on a substrate, comprising the steps of:
    depositing a first layer of insulation on said substrate;
    forming a first metallization pattern on a first region of said first layer of insulation;
    forming a moat around an island in a second region of said first layer of insulation;
    forming a second metallization pattern on said island;
    conformally depositing a second layer of insulation over said first layer of insulation and said first and second metallization patterns;
    performing chemical-mechanical polishing of said second layer of insulation;
    monitoring said polishing for exposure of said second metallization pattern; and
    ending said polishing upon exposure of said second metallization pattern, whereby planarization of said second layer of insulation above said first region is achieved.

2. The method of claim 1, wherein said first region of said first layer of insulation is further defined as a chip area of said substrate.

3. The method of claim 1, wherein size of the moat is selected to achieve a desired rate of accelerated insulation removal over said second metallization pattern in relation to insulation removal over said first metallization pattern.

4. The method of claim 1, wherein said second region of said first layer of insulation is further defined as a kerf area of said substrate.

5. The method of claim 1, wherein said second metallization pattern is used for performance testing purposes.

6. The method of claim 1, wherein said second metallization pattern is used for diagnostic purposes.

7. The method of claim 1, wherein said second metallization pattern is visually noticeable in relation to said second layer of insulation.

8. The method of claim 7, wherein said monitoring of said chemical-mechanical polishing is accomplished by visual observation.

9. A method for electrically determining planarization endpoint in chemical-mechanical polishing during integrated circuit fabrication on a substrate, said chemical-mechanical polishing including a polishing pad capable of electrical connection to a conducting surface in contact with said polishing pad, said method comprising:
    depositing a first layer of insulation on said substrate;
    forming a first metallization pattern on a first region of said first layer of insulation;
    forming a moat around an island in a second region of said first layer of insulation;
    forming a second metallization pattern on said island;
    electrically grounding said second metallization pattern;
    conformally depositing a second layer of insulation over said first layer of insulation and said first and second metallization patterns;
    performing chemical-mechanical polishing of said second layer of insulation;
    monitoring said polishing for an electrical connection between said polishing pad and said second metallization pattern; and
    ending said polishing in response to an electrical connection between said polishing pad and said second metallization pattern, whereby planarization of said second layer of insulation above said first region is achieved.

10. The method of claim 9, wherein said step of electrically grounding said second metallization pattern comprises:
    forming a diffusion layer between said substrate and said second region of said first layer of insulation; and
    electrically connecting said second metallization pattern to said diffusion layer.

11. The method of claim 10, wherein said step of electrically connecting said second metallization pattern to said diffusion layer comprises:
    forming said moat such that said diffusion layer beneath said moat is exposed; and
    forming said second metallization pattern such that it contacts said diffusion layer.

12. The method of claim 9, wherein said monitoring step includes employing a monitoring device for notifying an operator of an electrical connection between said polishing pad and said second metallization pattern.

13. The method of claim 12, wherein said monitoring device comprises a light emitting diode.

14. The method of claim 12, wherein said monitoring device comprises an oscilloscope.

15. The method of claim 9, further including the step of providing a signal in response to an electrical connection between said polishing pad and said second metallization pattern.

16. The method of claim 15, wherein said step of ending polishing is in response to said signal.

17. The method of claim 16, wherein said polishing is ended automatically in response to said signal.

18. The method of claim 9, wherein said first region of said first layer of insulation is further defined as a chip area of said substrate.

19. The method of claim 9, wherein moat size is selected to achieve a desired rate of accelerated insulation removal over said second metallization pattern in relation to insulation removal over said first metallization pattern.

20. The method of claim 9, wherein said second region of said first layer of insulation is further defined as a kerf area of said substrate.

21. The method of claim 9, wherein said second metallization pattern is used for performance testing purposes.

22. The method of claim 9, wherein said second metallization pattern is used for diagnostic purposes.

23. A method for determining planarization endpoint in chemical-mechanical polishing during integrated circuit fabrication on a substrate, comprising the steps of:

depositing a first layer of insulation on said substrate;

forming a metallization pattern on said first insulation layer in a non-kerf region of said integrated circuit;

forming a plurality of moats of varying width around islands in said first insulation layer in one or more kerf regions of said integrated circuit;

forming a metallization pattern on each of said plurality of islands;

choosing one of said plurality of island metallization patterns for monitoring;

conformally depositing a second layer of insulation over said first layer of insulation, said metallization pattern in said non-kerf region and said plurality of island metallization patterns;

performing chemical-mechanical polishing of said second layer of insulation;

monitoring said polishing for exposure of said chosen island metallization pattern; and ending said polishing upon exposure of said chosen island metallization pattern.

24. The method of claim 23, wherein said plurality of moats includes a first moat, a second moat and a third moat, said second moat having a larger width than said first moat and said third moat having a larger width than said second moat, and wherein said metallization pattern chosen for monitoring resides on said second moat island, and wherein exposure of said third moat island metallization pattern indicates a pre-planarization endpoint stage, and wherein exposure of said first moat island metallization pattern indicates planarization beyond endpoint.

* * * * *